(12) United States Patent　(10) Patent No.: US 7,545,174 B2
Senda et al.　(45) Date of Patent: Jun. 9, 2009

(54) LEVEL SHIFT CIRCUIT AND DISPLAY DEVICE HAVING THE SAME

(75) Inventors: Michiru Senda, Tokyo (JP); Ryoichi Yokoyama, Tokyo (JP)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/758,161

(22) Filed: Jun. 5, 2007

(65) Prior Publication Data

US 2007/0279093 A1　Dec. 6, 2007

(30) Foreign Application Priority Data

Jun. 5, 2006　(KR) ...................... 10-2006-0050501

(51) Int. Cl.
*H03K 19/0175*　(2006.01)
(52) U.S. Cl. .............................. 326/81; 326/68; 326/83; 327/333; 345/100; 345/211; 345/204
(58) Field of Classification Search ................... 326/68, 326/80–83, 88; 327/333; 345/76, 82, 98, 345/100, 204, 211
See application file for complete search history.

(56) References Cited

U.S. PATENT DOCUMENTS 5,646,642 A * 7/1997 Maekawa et al. ............. 345/99

2004/0257111 A1* 12/2004 Tobita ........................... 326/80
2005/0030264 A1* 2/2005 Tsuge et al. .................... 345/76
2005/0140421 A1* 6/2005 Shin ............................. 327/333
2005/0156917 A1* 7/2005 Tobita .......................... 345/204
2005/0212557 A1 9/2005 Nagata
2006/0006908 A1* 1/2006 Chung .......................... 326/80
2007/0052650 A1* 3/2007 Tai et al. ........................ 345/98

FOREIGN PATENT DOCUMENTS

JP　2000228628　8/2000
JP　2004048377　2/2004
JP　2005277671　10/2005

* cited by examiner

*Primary Examiner*—Vibol Tan
*Assistant Examiner*—Jany Tran
(74) *Attorney, Agent, or Firm*—Cantor Colburn LLP (57) ABSTRACT

A liquid crystal display ("LCD") includes a first voltage shift circuit at a front stage of an inverter circuit. The first voltage shift circuit includes a second transistor having a source serving as an input, and a gate and drain connected to each other, and is operated as a diode, and a first transistor having a source connected to a power supply, a gate connected to a ground, and a drain connected to the drain of the second transistor. An input signal shifts voltage by a threshold of the second transistor, and then is input into the inverter circuit. Further, a first condenser is inserted between an input node and the gate of the second transistor. Therefore, the LCD has a level shift circuit with a small circuit area and a rapid response speed.

5 Claims, 7 Drawing Sheets

LEVEL SHIFT CIRCUIT AND DISPLAY DEVICE HAVING THE SAME

This application claims priority to Korean Patent Application No. 2006-50501 filed on Jun. 5, 2006 and all the benefits accruing therefrom under 35 U.S.C. §119, the contents of which in its entirety are herein incorporated by reference.

BACKGROUND OF THE INVENTION

1. Field of the Invention

The present invention relates to a level shift circuit and a display device having the same. More particularly, the present invention relates to a level shift circuit converting a level of output signal from a circuit operated with one supply voltage into a level adaptable for a circuit operated with another supply voltage and a display device having the level shift circuit.

2. Description of the Related Art

Conventional technology of integrating a circuit, which is installed in a liquid crystal display ("LCD") on the same substrate as an LCD substrate, has been developed with the purpose of making compact and inexpensive LCDs with high precision. As a result, the LCD substrate integrating a driving circuit having thin film transistors ("TFTs") has been known.

Due to the use of TFTs, a peripheral circuit such as a data line driving circuit is partly integrated. Thus, the number of driving large scale integrated ("LSI") circuits is reduced, and a mounting cost is saved. For the data line driving circuit, a digital-to-analog converter ("DAC") converting digital display data into analog signals is mounted on the LCD substrate.

An image signal, which is input to the LCD substrate mounting the DAC, is a digital signal. This digital signal is usually generated by a signal processing circuit (also called an external signal processing circuit) installed outside the LCD substrate.

In general, the external signal processing circuit includes a complementary metal oxide semiconductor ("CMOS") integrated circuit, and it generally has a driving voltage lower than the supply voltage required to drive the TFT integrated circuit. For example, the external signal processing circuit is operated at a supply voltage of 3.3 V, and the TFT integrated circuit requires a supply voltage from 5 V to 10 V in order to drive the LCD substrate at a sufficient speed, or in order to apply a sufficient voltage to liquid crystals. Hence, the TFT circuit is driven by boosting a logic signal of 3.3 V to a range from 5 V to 10 V using a level shift circuit that is integrated on the LCD substrate. However, the conventional inverter type level shift circuits give rise to dispersion when processing high-speed data at the same time because a response speed is dependent on threshold dispersion of the transistor.

Further, many level shift circuits have been suggested, but each level shift circuit makes use of many circuit devices, and thus there is a large circuit area, as well as high power consumption. Moreover, when the TFT with low electron mobility is used, a transient response speed is lowered.

BRIEF SUMMARY OF THE INVENTION

The present invention provides a level shift circuit having a small area in order to obtain high integration, and a liquid crystal display ("LCD") having the level shift circuit.

The present invention also provides a level shift circuit having little quantity of a shoot-through current in order to obtain low power consumption, and an LCD having the level shift circuit.

Further, the present invention provides a level shift circuit having a rapid transient response speed suitable for high-speed operation, and an LCD having the level shift circuit.

In addition, the present invention provides a level shift circuit reducing threshold dispersion of a transistor, and an LCD having the level shift circuit.

In exemplary embodiments of the present invention, a level shift circuit converts a low voltage input signal from a voltage level of a first power supply to a desired voltage level of a second power supply. The level shift circuit includes a first voltage shift circuit, a first inverter circuit, and a second inverter circuit.

The first voltage shift circuit includes a first transistor having a source connected to the second power supply and a gate connected to a ground or the first power supply, a second transistor having a drain connected to a drain of the first transistor, a source connected to an input node into which the input signal is input, and a gate connected to the drain of the second transistor, and a first condenser having a first end connected to the gate and drain of the second transistor, and a second end connected to the source of the second transistor and the input node.

The first inverter circuit includes a third transistor having a source connected to the second power supply, and a gate that may be connected to the gate and drain of the second transistor and the first end of the first condenser, and a fourth transistor having a drain connected to a drain of the third transistor, a gate connected to the first end of the first condenser, the gate and drain of the second transistor, and that may further be connected to the gate of the third transistor, and a source connected to the ground.

The second inverter circuit includes a fifth transistor having a source connected to the second power supply, a gate connected to the drains of the third and fourth transistors, and a drain connected to an output node, and a sixth transistor having a drain connected to the drain of the fifth transistor and the output node, a gate connected to the drains of the third and fourth transistors, and the gate of the fifth transistor, and a source connected to the input node. Further, the input signal is input into the source of the second transistor, and into the gate of the second transistor and an input of the first inverter circuit via the first condenser.

In other exemplary embodiments of the present invention, a display device includes a display panel displaying an image in response to a driving signal, a driving unit providing the driving signal to the display panel in response to an image signal and voltage signals, a level shift circuit converting the voltage signals from a voltage level of a first power supply to a voltage level of a second power supply in response to control signals and providing converted voltage signals to the driving unit, and a driving circuit providing the image signal to the driving unit, and providing the control signals to the level shift circuit.

The level shift circuit includes a first voltage shift circuit, a first inverter circuit, and a second inverter circuit. The first voltage shift circuit includes a first transistor having a source connected to the second power supply and a gate connected to a ground or to the first power supply, a second transistor having a drain connected to a drain of the first transistor, a source connected to an input node into which an input signal is input, and a gate connected to the drain of the second transistor, and a first condenser having a first end connected to the gate and drain of the second transistor, and a second end connected to the source of the second transistor and the input node.

The first inverter circuit includes a third transistor having a source connected to the second power supply, and a gate that may be connected to the gate and drain of the second transistor and to the first end of the first condenser, and a fourth transistor having a drain connected to a drain of the third transistor, a gate connected to the gate and drain of the second transistor, to the first end of the first condenser, and that may be further connected to the gate of the third transistor, and a source connected to the ground.

The second inverter circuit includes a fifth transistor having a source connected to the second power supply, a gate connected to the drains of the third and fourth transistors, and a drain connected to an output node, and a sixth transistor having a drain connected to the drain of the fifth transistor and the output node, a gate connected to the drains of the third and fourth transistors, and the gate of the fifth transistor, and a source connected to the input node or to ground.

The input signal is input into the source of the second transistor, and into the gate of the second transistor and an input of the first inverter circuit via the first condenser.

According to the above, the LCD device can be highly integrated by reducing the area of the level shift circuit, and can reduce power consumption thereof by reducing the shoot-through current of the level shift circuit. Further, the level shift circuit can obtain a rapid transient response speed, and the level shift circuit and LCD that are not influenced by the threshold dispersion of the transistor can be provided.

BRIEF DESCRIPTION OF THE DRAWINGS

The above and other features and advantages of the present invention will become readily apparent by reference to the following detailed description when considered in conjunction with the accompanying drawings wherein.

DETAILED DESCRIPTION OF THE INVENTION

The invention will now be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present there between. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, the present invention will be explained in detail with reference to the accompanying drawings. While the display device of the present invention will be described as a liquid crystal display ("LCD"), the present invention is not limited to the LCD, but may also relate to other display devices, such as an electroluminescent ("EL") display.

First Embodiment

Figure 1:
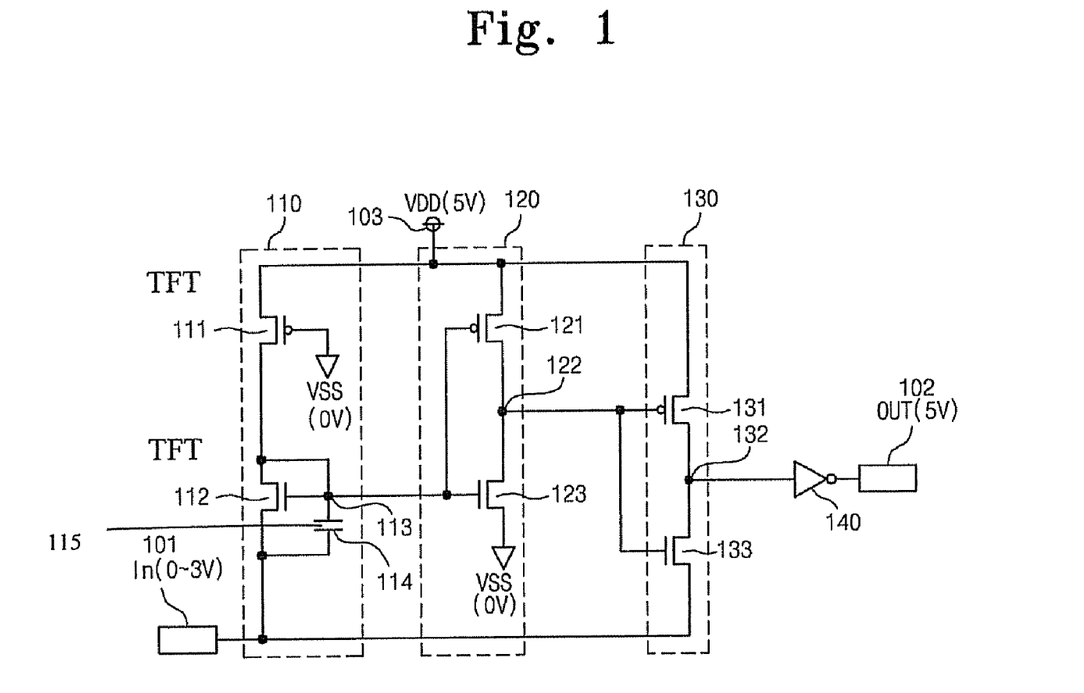
FIG. 1 is a circuit diagram showing an exemplary level shift circuit according to a first exemplary embodiment of the present invention.

FIG. 1 is a circuit diagram showing an exemplary level shift circuit according to a first exemplary embodiment of the present invention.

Figure 2:
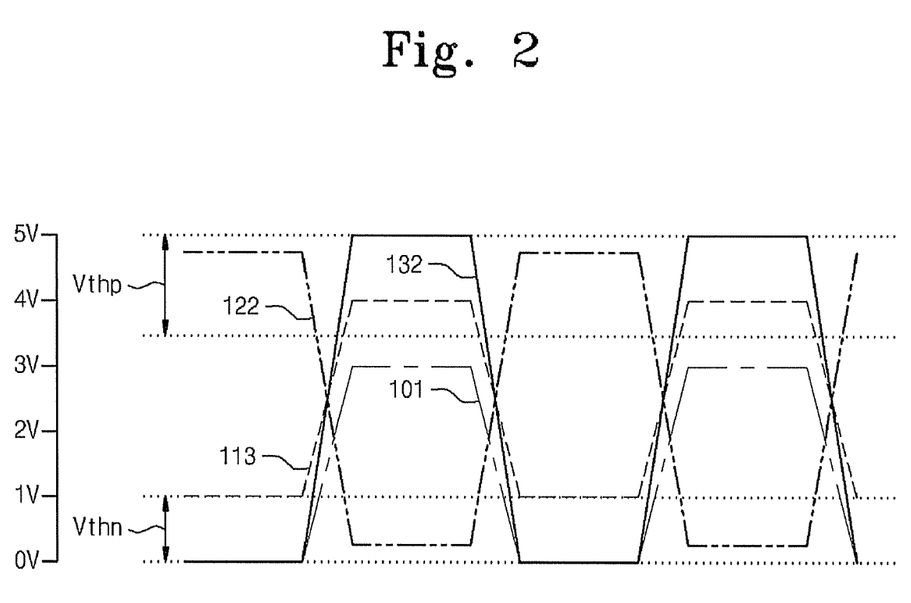
FIG. 2 is a timing diagram illustrating voltage waveforms of nodes of the exemplary level shift circuit of FIG. 1.

As illustrated in FIG. 1, the level shift circuit includes a first voltage shift circuit 110, a first inverter circuit 120, a second inverter circuit 130, and an inverter 140 connected to an output node 102. FIG. 2 is a timing chart illustrating voltage waveforms of input node 101, node 113, node 122, and node 132 of the level shift circuit of FIG. 1.

In the first exemplary embodiment of the present invention, the level shift circuit that converts an input signal of 3V peak-to-peak into an output signal of 5V peak-to-peak corresponding to a supply voltage VDD of 5 V is illustrated in FIG. 1 by way of example.

The first voltage shift circuit 110 illustrated in FIG. 1 includes a first transistor 111, a second transistor 112, and a first condenser 114. The first transistor 111 has a source connected to a power supply 103, such as VDD of 5V, a gate connected to a ground, such as VSS of 0V, and a drain connected to a drain of the second transistor 112. The second transistor 112 has the drain connected to the drain of the first transistor 111, a source connected to the input node 101, and a gate connected to the drain of the second transistor 112. The first condenser 114 has a first end connected to the gate and drain of the second transistor 112, and a second end connected to the source of the second transistor 112 and the input node 101.

Figure 3:
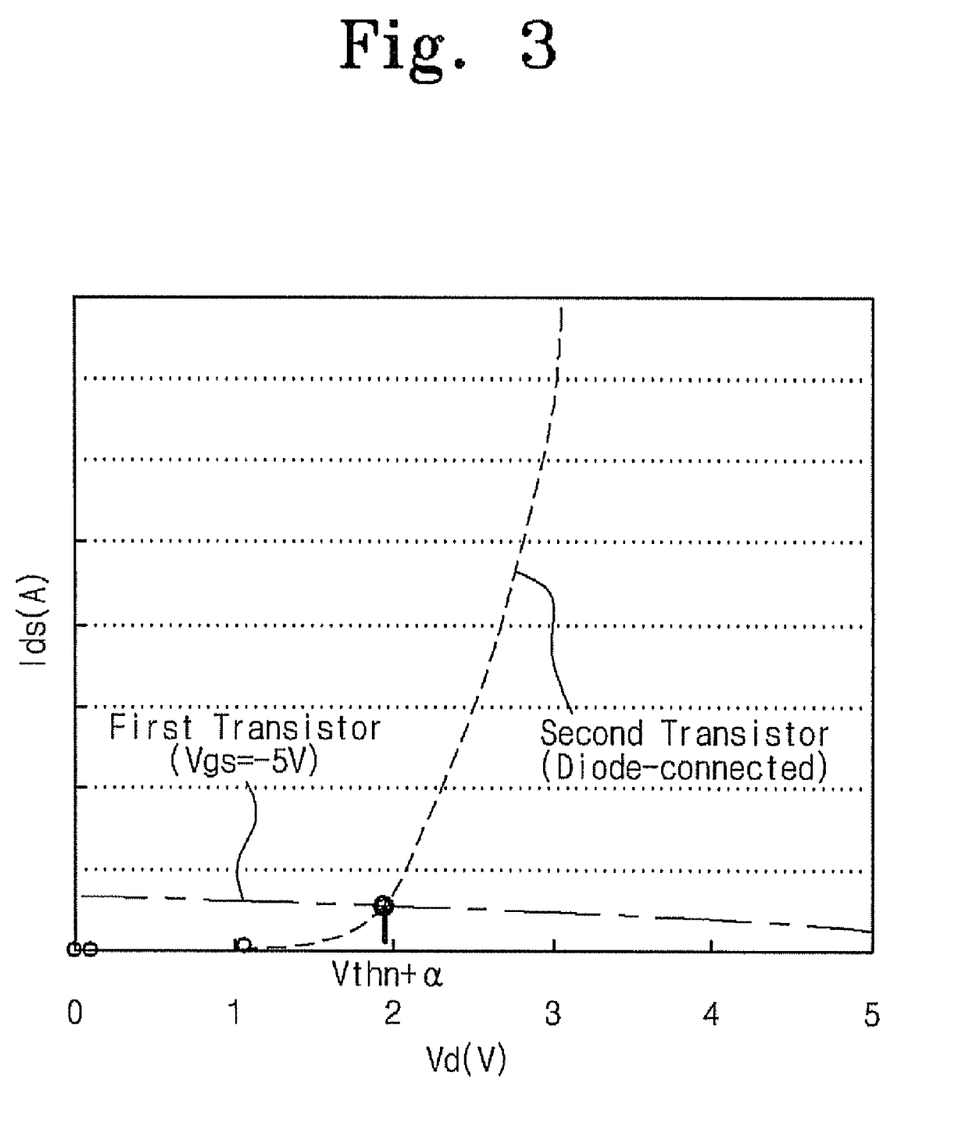
FIG. 3 illustrates current-to-voltage (Ids-Vd) characteristics of exemplary p-channel and n-channel transistors, which are used in an exemplary first voltage shift circuit of FIG. 1.

FIG. 3 illustrates current-to-voltage (Ids-Vd) characteristics of the first transistor 111 and the second transistor 112 which are applied to the first voltage shift circuit 110. In FIG. 3, the Ids is a current flowing from a drain of the first transistor 111 to a source of the first transistor 111, and the Vd is a voltage of drains of the first and second transistors 111 and 112. Also, 'Vthn+α' is a point that the drain-source current Ids flows through the second transistor 112, and the α is a voltage level of the input signal provided to the input node 101 in FIG. 3. The first transistor 111 shows a characteristic when a gate-source voltage Vgs is equal to −5 V because the source of the first transistor 111 is connected to the power supply 103 of 5 V, and the gate of the first transistor 111 is grounded (0 V). The second transistor 112 shows a characteristic when operated as a diode because the gate and drain thereof are directly connected to each other.

Since the source and gate of the first transistor 111 are connected to the supply voltage VDD of 5 V from power supply 103 and the ground VSS (0 V), respectively, the first transistor 111 illustrated in FIG. 1 is in an ON state. As described above, the second transistor 112 is operated as a diode since the drain and gate thereof are shorted. In this manner, since the first transistor 111 is in the ON state and the second transistor 112 is operated as the diode, the node 113 has an electric potential higher than that of the input signal of the input node 101 by a threshold of the second transistor 112.

A transient response to the input signal of the input node 101 can be advanced by inserting the first condenser 114 between the input node 101 and the gate of the second transistor 112, and more particularly between the input node 101 and the node 113. When each of the first and second transistors 111 and 112 makes use of a thin film transistor ("TFT"), each has low electron mobility and high operating voltage, compared to a metal oxide semiconductor ("MOS") transistor. In this manner, the insertion of the first condenser 114 makes high-speed operation possible.

The input signal, which is input from the input node 101, is input into the source of the second transistor 112. In the second transistor 112, an electric potential of the gate thereof (i.e. an electric potential of the node 113) is higher than that of the input signal, which is input into the source of the second transistor 112, by a threshold Vthn. The second transistor 112 functions as a diode in which the drain of the second transistor 112 serves as an anode and the source of the second transistor 112 serves as a cathode, because the drain and gate thereof are shorted to each other.

The first inverter circuit 120 includes a third transistor 121 and a fourth transistor 123. The third transistor 121 has a source connected to the power supply 103, a gate connected to the node 113, and a drain connected to a drain (node 122) of the fourth transistor 123. The fourth transistor 123 has the drain (node 122) connected to the drain of the third transistor 121, a gate connected to the node 113 and the gate of the third transistor 121, and a source connected to the ground VSS.

The first inverter circuit 120, which operates as an inverter circuit, outputs an inverse signal of the signal of the node 113 to the node 122. Voltages applied to the gate of the third transistor 121 and the gate (node 113) of the fourth transistor 123 have an electric potential higher than that of the input signal by the threshold Vthn of the second transistor 112.

When the input signal is a low level LO of 0 V, the voltages applied to the gate of the third transistor 121 and the gate (node 113) of the fourth transistor 123 are nearly equal to the threshold Vthn of the second transistor 112. Hence, the third transistor 121 becomes an ON state, while the fourth transistor 123 becomes an OFF state. At this time, a minute current flows between the node 122 and the ground because a gate-source voltage Vgs of the fourth transistor 123 is slightly higher than the threshold, and thus the electric potential of the node 122 is slightly lower than the supply voltage VDD of 5 V, as shown in FIG. 2.

In contrast, as also shown in FIG. 2, when the input signal is a high level HI of 3 V, the first transistor 111 is in the ON state and the second transistor 112 is operated as the diode, because the voltages applied to the gate of the third transistor 121 and the gate (node 113) of the fourth transistor 123 are 4 V, which is an electric potential overlapping with the threshold Vthn of the second transistor 112. Here, the electric potential of the node 113 when the input signal is the high level HI of 3 V is expressed by HI of the node 113. Further, the threshold of the third transistor 121 is expressed by Vthp 121. When the power supply 103 has a voltage of 5 V, the Vthp 121 is greater than 1 V, and the input signal is HI of 3 V, the third transistor 121 becomes an OFF state, while the fourth transistor 123 becomes an ON state. Thus, the electric potential of the node 122 is slightly higher than a ground potential VSS of 0 V since a drain-source voltage Vds of the fourth transistor 123 is not completely 0 V.

Because a voltage effect is caused to a certain extent by the drain-source voltage Vds of the third transistor 121 in the ON state and the drain-source voltage Vds of the fourth transistor 123 in the ON state, the output signal does not amount to 5V peak-to-peak only with the first inverter circuit 120. Hence, the second inverter circuit 130 is added to allow the output signal to amount to 5V peak-to-peak.

The second inverter circuit 130 includes a fifth transistor 131 and a sixth transistor 133. The fifth transistor 131 has a source connected to the power supply 103, a gate connected to the node 122 and to a gate of the sixth transistor 133, and a drain connected to a drain (node 132) of the sixth transistor 133. The sixth transistor 133 has the drain (node 132) connected to the drain of the fifth transistor 131, a gate connected to the node 122 and to the gate of the fifth transistor 131, and a source connected to the input node 101.

As shown in FIG. 2, when the input signal is a low level LO of 0 V, the electric potential of the node 122 which is applied to the second inverter circuit 130 is slightly lower than the supply voltage VDD of 5 V. Hence, the fifth transistor 131 becomes an OFF state, while the sixth transistor 133 becomes an ON state. At this time, the electric potential of the node 132 is nearly equal to the ground potential VSS of 0 V, because a drain-source voltage Vds of the sixth transistor 133 amounts to about 0 V.

In contrast, and as further shown in FIG. 2, when the input signal is a high level HI of 3 V, the electric potential of the node 122 which is applied to the second inverter circuit 130 is slightly higher than the ground potential VSS of 0 V. Hence, the fifth transistor 131 becomes an ON state, while the sixth transistor 133 becomes an OFF state. At this time, the electric potential of the node 132 is nearly equal to the supply voltage VDD of 5 V, because a drain-source voltage Vds of the fifth transistor 131 amounts to about 0 V.

The node 132 has the signal in-phase with that of the input node 101, and may be additionally connected with the inverter 140 in order to invert the output signal. Further, the source of the sixth transistor 133 may be connected to the ground rather than the input node 101.

As described above, according to the first exemplary embodiment of the present invention, because the level shift circuit has only a few devices, its area can be reduced, and thus its integration can be enhanced. Further, although the shoot-through current flows between the supply voltage VDD and the ground potential VSS or GND of the first inverter circuit 120, the shoot-through current can be minimized because, when the third 121 becomes the OFF state and the fourth transistors 123 becomes the On state, the gate-source voltage Vgs of each of the third and fourth transistors 121 and 123 is near the threshold Vthp. Furthermore, the first condenser 114 is inserted as an input, and thus the transient response speed can be increased to cope with high-speed operation. In addition, although the thresholds Vthn of the second transistor 112 are dispersed, the first inverter circuit 120 is provided with the first voltage shift circuit 110 as an input, and thus an influence of the threshold dispersion of the second transistor 112 can be kept at a minimum.

Meanwhile, the first condenser 114 can be formed by using parasitic capacitance between interconnections, interlayer capacity of a multilayer interconnection, or capacity between a semiconductor layer and a gate electrode material. In this manner, when the first condenser 114 is formed by using the parasitic capacitance between interconnections, the interlayer capacity of a multilayer interconnection, or the capacity between a semiconductor layer and a gate electrode material, a space 115 between the interconnections (not shown), an interlayer of the multilayer interconnection (not shown), or a space 115 between the semiconductor layer and the gate electrode (both not shown) can be effectively used, and thus the area of the level shift circuit can be further reduced.

Second Embodiment

Figure 4:
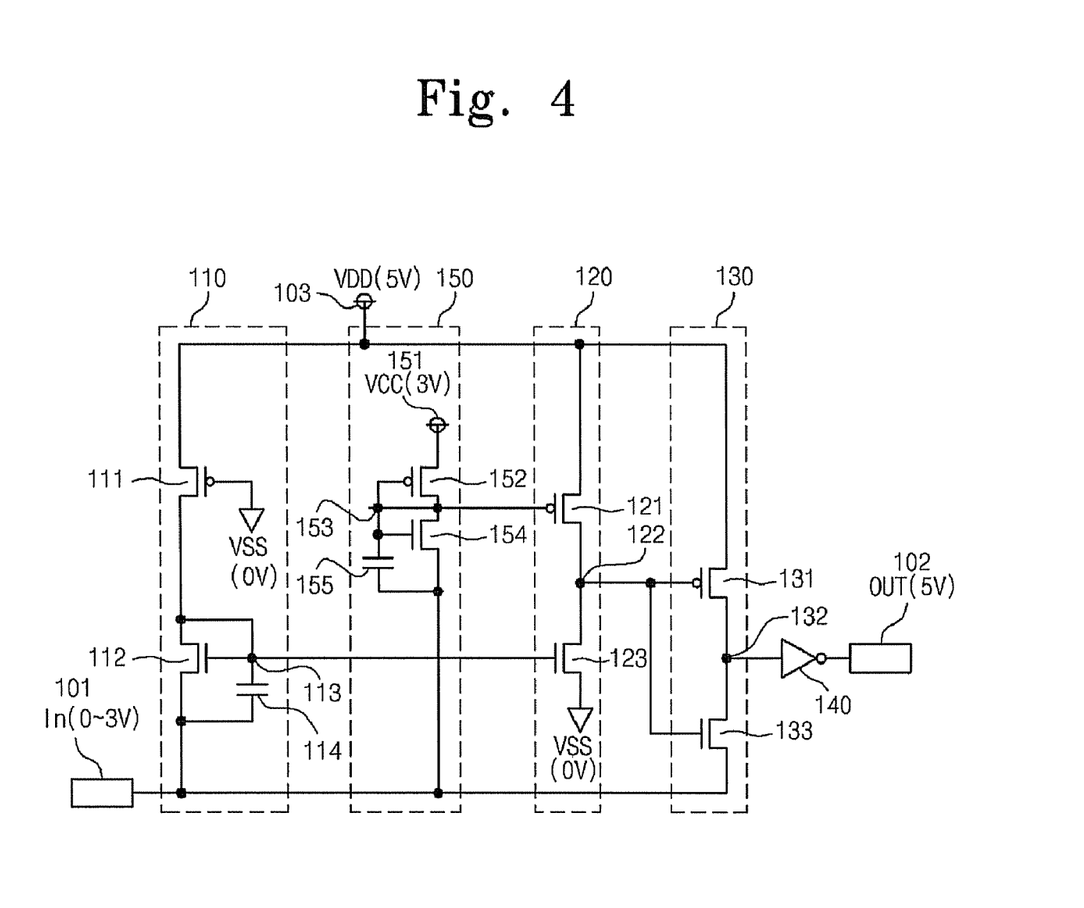
FIG. 4 is a circuit diagram showing an exemplary level shift circuit according to a second exemplary embodiment of the present invention.

FIG. 4 is a circuit diagram showing an exemplary level shift circuit according to a second exemplary embodiment of the present invention.

As illustrated in FIG. 4, the level shift circuit includes a first voltage shift circuit 110, a second voltage shift circuit 150, a first inverter circuit 120, a second inverter circuit 130, and an inverter 140 connected to an output node 102.

In the second exemplary embodiment of the present invention, the level shift circuit that converts an input signal of 3V peak-to-peak into an output signal of 5V peak-to-peak corresponding to a supply voltage VDD of 5 V is illustrated in FIG. 4 by way of example.

Comparatively, the first voltage shift circuit 110 according to the second exemplary embodiment of the present invention may have the same construction as that of the first exemplary embodiment of the present invention. Thus, the first and second transistors 111 and 112 used in the first voltage shift circuit 110 have the same characteristic. Further, the first inverter circuit 120 and the second inverter circuit 130 may also have the same construction as in the first exemplary embodiment.

However, the level shift circuit according to the second exemplary embodiment of the present invention is different from the first exemplary embodiment of the present invention in that it further includes the second voltage shift circuit 150.

In the level shift circuit according to the first exemplary embodiment of the present invention, the input signal is shifted by the threshold Vthn of the second transistor 112 by means of the first voltage shift circuit 110, and then is input into the gates of the third and fourth transistors 121 and 123 of the first inverter circuit 120.

In contrast, in the level shift circuit according to the second exemplary embodiment of the present invention, as illustrated in FIG. 4, the input signal is shifted by the threshold Vthn of the second transistor 112 by means of the first voltage shift circuit 110, and then is input into the gate of the fourth transistor 123 of the first inverter circuit 120, but not the gate of the third transistor 121. Further, the input signal is shifted by the threshold of a transistor within the second voltage shift circuit 150 by means of the second voltage shift circuit 150, and then is input into the gate of the third transistor 121 of the first inverter circuit 120.

Similar to the first voltage shift circuit 110 according to the first exemplary embodiment of the present invention, the first voltage shift circuit 110 according to the second exemplary embodiment of the present invention also includes a first transistor 111, a second transistor 112, and a first condenser 114. The first transistor 111 has a source connected to a power supply 103, providing supply voltage VDD of for example 5V, a gate connected to a ground, such as VSS of 0V, and a drain connected to a drain of the second transistor 112. The second transistor 112 has the drain connected to the drain of the first transistor 111, a source connected to an input node 101, and a gate connected to the drain of the second transistor 112. The first condenser 114 has a first end connected to the gate and drain of the second transistor 112, and a second end connected to the source of the second transistor 112 and the input node 101.

The first transistor 111 is in an ON state, because the source of the first transistor 111 is connected to the supply voltage VDD of 5 V from the power supply 103, and the gate of the first transistor 111 is grounded. As described above, the second transistor 112 is operated as a diode since the drain and gate of the second transistor 112 are shorted to each other. In this manner, since the first transistor 111 is in the ON state and the second transistor 112 is operated as the diode, the node 113 has an electric potential higher than that of the input signal of the input node 101 by a threshold of the second transistor 112.

A transient response to the input signal can be advanced by inserting the first condenser 114 between the input node 101 and the gate of the second transistor 112, and more particularly between the input node 101 and the node 113. When each transistor makes use of a TFT, each has low electron mobility and high operating voltage, compared to an MOS transistor. In this manner, the insertion of the first condenser 114 makes high-speed operation possible.

The input signal, which is input from the input node 101, is input into the source of the second transistor 112. In the second transistor 112, an electric potential of the gate of the second transistor 112 (i.e. an electric potential of the node 113) is higher than that of the input signal by a threshold Vthn, which is input into the source thereof. The second transistor 112 functions as a diode in which the drain of the second transistor 112 serves as an anode and the source of the second transistor 112 serves as a cathode, because the drain and gate thereof are shorted to each other.

Unlike the level shift circuit of the first exemplary embodiment of the present invention, the level shift circuit of the second exemplary embodiment of the present invention includes the second voltage shift circuit 150. The second voltage shift circuit 150 includes a seventh transistor 152, an eighth transistor 154, and a second condenser 155. The seventh transistor 152 has a source connected to a power supply 151 of 3 V, and a gate connected to a drain of the seventh transistor 152 and to a gate of the eighth transistor 154, and is connected to the gate of the third transistor 121 of the first inverter circuit 120. The eighth transistor 154 has the drain connected to the drain of the seventh transistor 152, a source connected to the input node 101, and a gate connected with the drain of the eighth transistor 154. The second condenser 155 has a first end connected to the gate and drain of the eighth transistor 154, and a second end connected to the source of the eighth transistor 154 and the input node 101.

The input signal, which is input from the input node 101, is input into the source of the eighth transistor 154. The eighth transistor 154 functions as a diode in which the drain of the eighth transistor 154 serves as an anode and the source of the eighth transistor 154 serves as a cathode, because the drain and gate thereof are shorted to each other.

In the eighth transistor 154, an electric potential of the gate of the eighth transistor 154 (i.e. an electric potential of a node 153) is higher than that of the input signal from the input node 101 by a threshold Vthn of the eighth transistor 154, which is input into the source thereof. Specifically, when the input signal is a low level LO of 0 V, the electric potential of a node 153 has the threshold Vthn of the eighth transistor 154, and when the input signal is a high level HI of 3 V, the electric potential of a node 153 has a voltage higher than 3V by the threshold Vthn of the eighth transistor 154.

The seventh transistor 152 also functions as a diode in which the drain of the seventh transistor 152 serves as an anode and the source of the seventh transistor 152 serves as a cathode, because the drain and gate thereof are shorted to each other. Therefore, when the input signal is a low level LO of 0 V, the seventh transistor 152 is turned-on, and when the input signal is a high level HI of 3 V, the seventh transistor 152 is turned-off.

Figure 5:
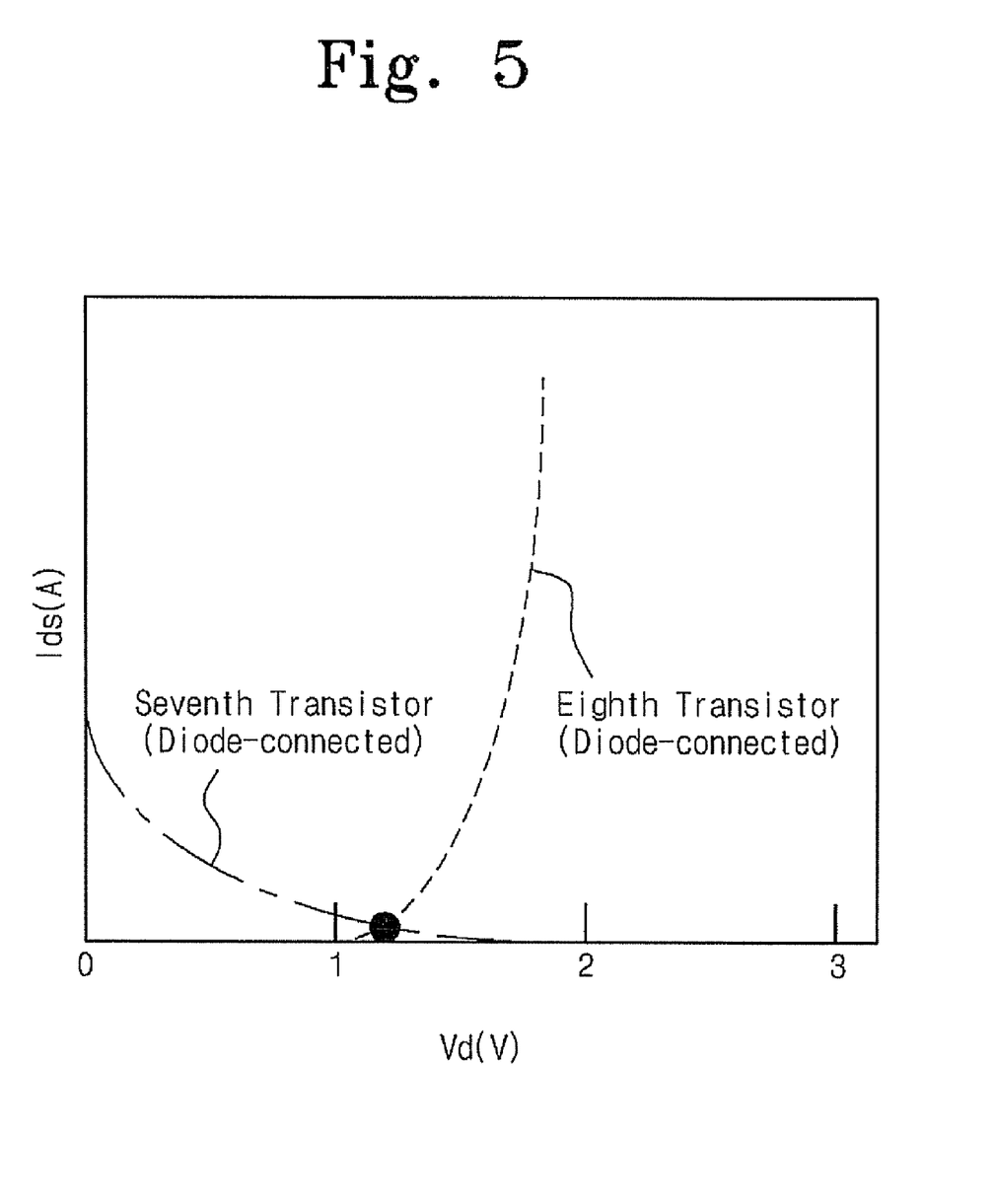
FIG. 5 illustrates current-to-voltage (Ids-Vd) characteristics of exemplary p-channel and n-channel transistors, which are used in an exemplary second voltage shift circuit of FIG. 4.

FIG. 5 illustrates current-to-voltage (Ids-Vd) characteristics of the seventh transistor 152 and the eighth transistor 154 which are used in the second voltage shift circuit 150. In FIG. 5, the Ids is a current flowing from a drain of the seventh transistor 152 to a source of the seventh transistor 152, and the Vd is a voltage of drains of the seventh and eighth transistors 152 and 154. Also, 'Vthn+α' is a point that the drain-source current Ids flows through the eighth transistor 154, and the α is a voltage level of the input signal provided to the input node 101 in FIG. 5. The seventh transistor 152 and eighth transistor 154 show such characteristics when they are operated as diodes since the gates and drains thereof are directly connected to each other.

As in the first exemplary embodiment of the present invention, the first inverter circuit 120 includes a third transistor 121 and a fourth transistor 123. A difference between the first exemplary embodiment of the present invention and the second exemplary embodiment of the present invention is that the gate of the third transistor 121 is connected to the output node 153 of the second voltage shift circuit 150 rather than the node 113 of the first voltage shift circuit 110.

The first inverter circuit 120, operated as an inverter circuit, outputs an inverse signal of the input signal of the input node 101 to the node 122. The voltage applied to the gate (node 153 from the second voltage shift circuit 150) of the third transistor 121 has an electric potential higher than that of the input signal by the threshold Vthn of the eighth transistor 154. Further, the voltage applied to the gate (node 113 from the first voltage shift circuit 110) of the fourth transistor 123 has an electric potential higher than that of the input signal by the threshold Vthn of the second transistor 112.

When the input signal is a low level LO of 0 V, the seventh transistor 152 is in the ON state and the eighth transistor 154 is operated as the diode, because the voltage applied to the gate (node 153) of the third transistor 121 is equal to the threshold Vthn of the eighth transistor 154, and thus the third transistor 121 becomes an ON state. Further, the voltage applied to the gate (node 113) of the fourth transistor 123 is equal to the threshold Vthn of the second transistor 112, and thus the fourth transistor 123 becomes an OFF state. In the second exemplary embodiment, since a gate-source voltage Vgs of the fourth transistor 123 is slightly higher than the threshold, a minute current flows between the node 122 and the ground VSS, and thus the electric potential of the node 122 is slightly lower than the supply voltage VDD of 5 V.

Also in the second exemplary embodiment, when the input signal is a high level HI of 3 V, the seventh transistor 152 is in the ON state and the eighth transistor 154 is operated as the diode, because the electric potential of the node 113 is expressed by HI of the node 113, and further the threshold of the third transistor 121 is expressed by Vthp 121.

When the input signal is the high level HI of 3 V, the voltage applied to the gate (node 113) of the fourth transistor 123 is 4 V, which is an electric potential overlapping with the threshold Vthn of the second transistor 112. Further, the voltage applied to the gate (node 153) of the third transistor 121 is 4 V, which is slightly lower than an electric potential overlapping with the threshold Vthn of the eighth transistor 154. Since the input signal and the VCC power supply 151 connected to the source of the seventh transistor 152 have the same electric potential of 4 V, no shoot-through current flows, but the eighth transistor 154 is weakly powered on. As a result, the voltage of the node 153 is 4 V, which is slightly lower than the electric potential overlapping with the threshold Vthn of the eighth transistor 154. Because the voltage of the node 153 becomes near maximum 4 V when the input signal has a considerably low frequency, the frequency of the input signal is preferably greater than 3 KHz. When the supply voltage VDD of the power supply 103 has a voltage of 5 V, when the Vthp 121 is greater than 1 V, and when the input signal is HI of 3 V, the third transistor 121 becomes an OFF state, while the fourth transistor 123 becomes an ON state.

When the input signal is the low level LO of 0 V, the electric potential of the node 122 is slightly lower than the supply voltage VDD of 5 V, because a drain-source voltage Vds of the third transistor 121 is not completely 0 V.

Since a voltage effect is caused to a certain extent by the drain-source voltage Vds of the third transistor 121 in the ON state and the drain-source voltage Vds of the fourth transistor 123 in the ON state, the output signal, such as at node 122, does not amount to 5V peak-to-peak only with the first inverter circuit 120. Hence, the second inverter circuit 130 is added to allow the output signal to amount to 5V peak-to-peak.

As in the first exemplary embodiment of the present invention, the second inverter circuit 130 includes a fifth transistor 131 and a sixth transistor 133. The fifth transistor 131 has a source connected to the power supply 103, a gate connected to the node 122 and to a gate of the sixth transistor 133, and a drain connected to a drain (node 132) of the sixth transistor 133. The sixth transistor 133 has the drain connected to the drain (node 132) of the fifth transistor 131, the gate connected to the node 122 and to the gate of the fifth transistor 131, and a source connected to the input node 101.

When the input signal from input node 101 is a low level LO of 0 V, the electric potential of the node 122, which is applied to the second inverter circuit 130, is slightly lower than the supply voltage VDD of 5 V. Hence, the fifth transistor 131 becomes an OFF state, while the sixth transistor 133 becomes an ON state. At this time, the electric potential of the node 132 is nearly equal to the ground potential VSS of 0 V, because a drain-source voltage Vds of the sixth transistor 133 amounts to about 0 V.

In contrast, when the input signal from input node 101 is a high level HI of 3 V, the electric potential of the node 122, which is applied to the second inverter circuit 130, is slightly higher than the ground electric potential VSS of 0 V. Hence, the fifth transistor 131 becomes an ON state, while the sixth transistor 133 becomes an OFF state. At this time, the electric potential of the node 132 is nearly equal to the supply voltage VDD of 5 V, because a drain-source voltage Vds of the fifth transistor 131 amounts to about 0 V.

The node 132 has the signal in-phase with that of the input node 101, as previously described with respect to FIG. 2, and may be additionally connected with the inverter 140 in order to invert the output signal. Further, the source of the sixth transistor 133 may be connected to the ground rather than the input node 101.

Meanwhile, similar to the first condenser 114, the second condenser 155 can be formed by using parasitic capacitance between interconnections, interlayer capacity of a multilayer interconnection, or capacity between a semiconductor layer and a gate electrode material. In this manner, if the second condenser 155 is formed by using the parasitic capacitance between interconnections, a space between the interconnections, an interlayer of the multilayer interconnection, or a space between the semiconductor layer and the gate electrode is possible to be effectively used, and thus the area of the level shift circuit can be further reduced.

As described above, according to the second exemplary embodiment of the present invention, the level shift circuit includes the first voltage shift circuit 110 as well as the second voltage shift circuit 150 as an input, and threshold dispersion of the third transistor (p-channel transistor) 121 can be absorbed. In the first exemplary embodiment, when both the threshold of the fourth transistor (n-channel transistor) 123 and the threshold of the third transistor (p-channel transistor) 121 are high, the electric potential of the node 113 may be increased making it difficult to power on the third transistor 121, and thus the response speed may be delayed. However, in the second exemplary embodiment, although the threshold of the third transistor 121 is high, the voltage of the gate (node 153) of the third transistor 121 can be designed so as not to be increased. This helps to avoid the problem of the third transistor 121, which is difficult to be powered on so that the response speed is delayed.

Third Embodiment

Figure 6:
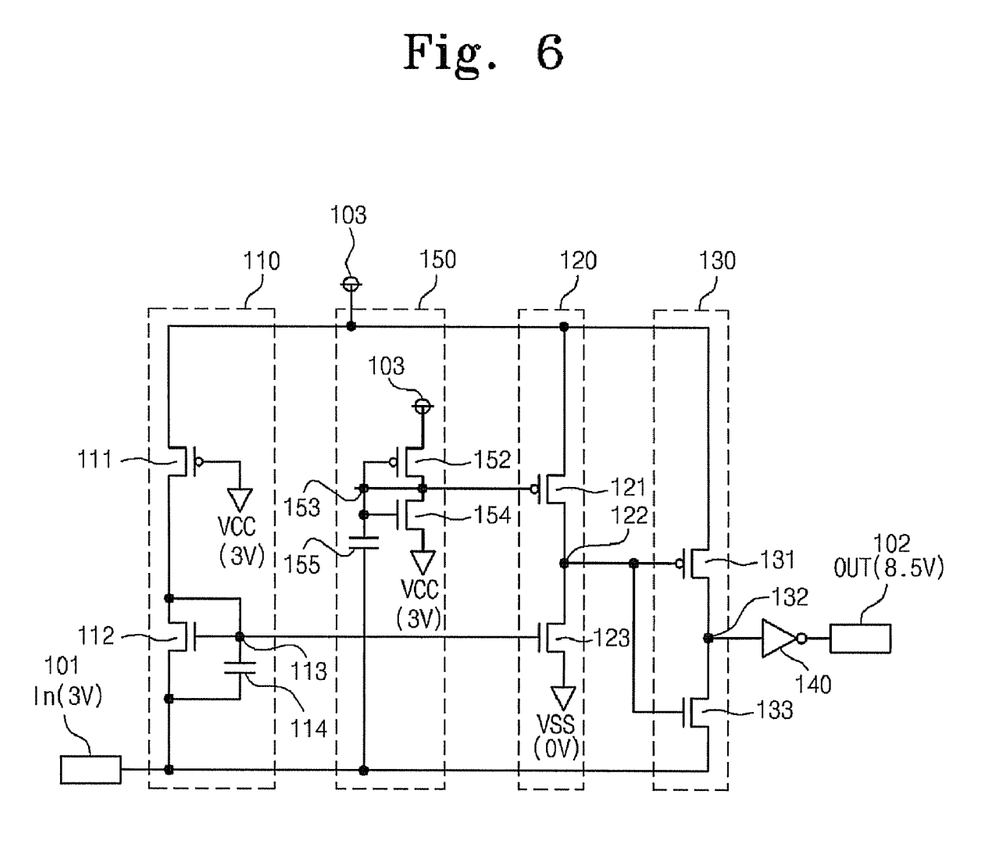
FIG. 6 is a circuit diagram showing an exemplary level shift circuit according to a third exemplary embodiment of the present invention.

FIG. 6 is a circuit diagram showing an exemplary level shift circuit according to a third exemplary embodiment of the present invention. In the third exemplary embodiment of the present invention, the level shift circuit that converts an input signal of 3V peak-to-peak into an output signal of 8.5V peak-to-peak corresponding to a supply voltage VDD of 8.5 V is illustrated in FIG. 6 by way of example.

The differences between the second and third exemplary embodiments of the present invention are as follows. That is, the gate of a first transistor 111 used in a first voltage shift circuit 110 is connected to a power supply VCC of 3 V. The source of a seventh transistor 152 used in a second voltage shift circuit 150 is connected to a power supply 103 of 8.5 V, while the source of an eighth transistor 154 used in the second voltage shift circuit 150 is connected to the power supply VCC of 3 V. Further, a second condenser 155 is connected to an input node 101. When an input signal from the input node 101 is a high level HI of 3 V, the voltage of a node 153 is preferably set to be lower than the supply voltage of 8.5 V from power supply 103 by a threshold of the seventh transistor (p-channel transistor) 152.

The other elements and configurations of the level shift circuit according to the third exemplary embodiment may be substantially the same or equal to those of the second exemplary embodiment of the present invention. According to the third exemplary embodiment of the present invention, although a voltage difference between the input and output signals is more than 5 V, an influence of threshold dispersion of the third and fourth transistors 121 and 123 can be minimized, and thus the level shift circuit having a rapid transient response speed can be provided.

Fourth Embodiment

Figure 7:
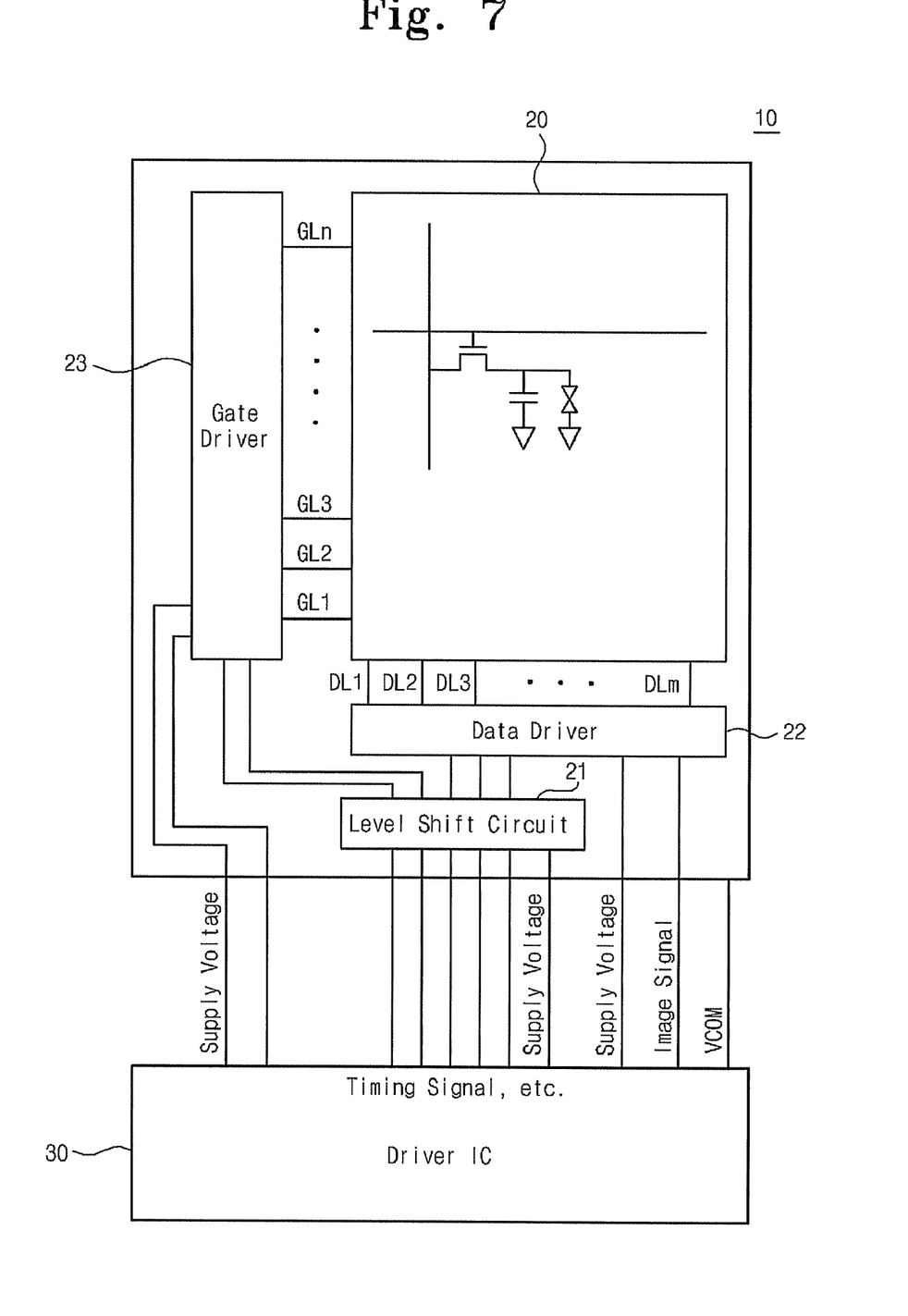
FIG. 7 is a block diagram showing an exemplary liquid crystal display ("LCD") according to a fourth exemplary embodiment of the present invention.

FIG. 7 is a block diagram showing an exemplary LCD according to a fourth exemplary embodiment of the present invention. The LCD according to the fourth exemplary embodiment of the present invention is operated using battery power used in a middle-sized or a small-sized mobile display. The LCD 10 includes a display panel unit 20, a level shift circuit 21, a data driver 22, a gate driver 23, and a driver integrated circuit ("IC") 30.

The driver IC 30 outputs a supply voltage and a plurality of signals that are input into the level shift circuit 21, a supply voltage that is input into the gate driver 23, an image signal and a supply voltage that are input into the data driver 22, and a common electrode voltage VCOM that is input into the display panel unit 20.

The display panel unit 20 includes a plurality of data lines DL1 through DLm connected to the data driver 22, and a plurality of gate lines GL1 through GLn connected to the gate driver 23. The display panel unit 20 includes a plurality of pixels arranged in a matrix form composed of rows and columns, wherein the pixels arranged in a predetermined number of rows are commonly connected with any one of the data lines DL1 through DLm. Each pixel region includes a TFT, a liquid crystal capacitor connected between a drain electrode of the TFT and a common electrode, and a thin film storage capacitor connected in parallel with the liquid crystal capacitor. The display panel unit 20 displays an image in response to data signals output from the data driver 22 to the data lines DL1 through DLm and gate driver control signals output from the gate driver 23 to the gate lines GL1 through GLn.

The gate driver 23 outputs the gate driver control signal (including VGH or VGOFF of a logic level) to the gate lines GL1 through GLn in order to drive at least one selected gate line.

The data driver 22 determines data signals output to the data lines DL1 through DLm in response to the data signals and data control signals. In other words, the data driver 22 drives the plurality of data lines DL1 through DLm of the LCD panel unit 20 in response to the plurality of data control signals.

The level shift circuit 21 includes a plurality of level shift circuits, which boost a logic signal of, for instance, 3.3 V to that between about 5 V and about 10 V and drive the TFT within each pixel of the display panel unit 20 at a sufficient speed, or apply a sufficient voltage to liquid crystals within a liquid crystal layer of the LCD 10. In the LCD 10 according to the fourth exemplary embodiment shown in FIG. 7, the level shift circuit 21 is disposed at a front stage of the data driver 22 and gate driver 23, but alternatively it may be disposed inside the data driver 22 or the gate driver 23. In addition, it may be integrated in the data driver.

In designing the LCD illustrated in FIG. 7, and particularly the LCD implemented for a handheld device such as personal digital assistant ("PDA") or a small-sized device such as a mobile phone, a structure where the LCD can be made compact is expected. Moreover, as in the first through third exemplary embodiments of the present invention, the level shift circuit has only a few number of circuit devices, thereby providing the LCD with a small size and high data-processing speed.

As can be seen from the foregoing, according to the present invention, the LCD device can be highly integrated by reducing the area of the level shift circuit, and can reduce consumption power by reducing the shoot-through current of the level shift circuit. Further, the level shift circuit can obtain rapid transient response speed, and the level shift circuit and LCD that are not influenced by the threshold dispersion of the transistor can be provided.

Although first through fourth exemplary embodiments of the present invention have been described, it is understood that the present invention should not be limited to these exemplary embodiments but various changes and modifications can be made by one of ordinary skill in the art within the spirit and scope of the present invention as hereinafter claimed.

What is claimed is:

1. A level shift circuit outputting a signal by converting a low-voltage input signal having a voltage level of a first power supply into an output signal having a desired voltage level of a second power supply, the level shift circuit comprising:
   a first voltage shift circuit:
   a first inverter circuit;
   a second voltage shift circuit; and
   the first voltage shift circuit comprising:
      a first transistor having a source connected to the second power supply and a gate connected to one of a ground and the first power supply;
      a second transistor having a drain connected to a drain of the first transistor, a source connected to an input node, and a gate connected to the drain of the second transistor; and
      a first condenser having a first end connected to the gate and drain of the second transistor, and a second end connected to the source of the second transistor and the input node,
   the first inverter circuit comprising:
      a third transistor having a source connected to the second power supply, and a gate; and
      a fourth transistor having a drain connected to a drain of the third transistor, a gate connected to the gate and drain of the second transistor, and to the first end of the first condenser, and a source connected to the ground,
   the second voltage shift circuit comprising:
      a seventh transistor having a source connected to one of the first power supply providing the input signal and the second power supply, and a gate and a drain connected to each other and the gate of the third transistor;
      an eighth transistor having a drain connected to a gate of the eighth transistor as well as to the drain and gate of the seventh transistor; and
      a second condenser having a first end connected to the drain and gate of the seventh transistor and to the gate and drain of the eighth transistor, and a second end connected to at least one of the source of the eighth transistor and the input node,
   wherein the input signal is input from the input node into the source of the second transistor.

2. The level shift circuit of claim 1, further comprising a second inverter circuit comprising:
   a fifth transistor having a source connected to the second power supply, a gate connected to the drain of the third transistor and to the drain of the fourth transistor, and a drain connected to an output node; and
   a sixth transistor having a drain connected to the drain of the fifth transistor and to the output node, a gate connected to the drain of the third transistor and to the drain of the fourth transistor, and to the gate of the fifth transistor, and a source connected to one of the ground and the input node.

3. The level shift circuit of claim 2, wherein the gate of the first transistor is connected to the first power supply, the source of the eighth transistor is connected to the first power supply, and the second end of the second condenser is connected to the input node.

4. The level shift circuit of claim 2, further comprising an inverter connected to an output of the second inverter circuit.

5. A display device comprising:
   a display panel displaying an image in response to a driving signal;
   a driving unit providing the driving signal to the display panel in response to an image signal and voltage signals;
   a level shift circuit converting the voltage signals from a voltage level of a first power supply to a voltage level of a second power supply in response to control signals and providing converted voltage signals to the driving unit; and
   a driving circuit providing the image signal to the driving unit, and providing the control signals to the level shift circuit,
   wherein the level shift circuit comprises
   a first voltage shift circuit comprising:
      a first transistor having a source connected to the second power supply and a gate;
      a second transistor having a drain connected to a drain of the first transistor, a source connected to an input node into which an input signal having the voltage level of the first power supply is input, and a gate connected to the drain of the second transistor, and outputting voltage higher than that of the input signal by a threshold through the gate of the second transistor; and
      a first condenser having a first end connected to the gate and drain of the second transistor, and a second end connected to the source of the second transistor and the input node;
   a first inverter circuit comprising:
      a third transistor having a source connected to the second power supply, and a gate; and
      a fourth transistor having a drain connected to a drain of the third transistor, a gate connected to the gate and drain of the second transistor, and to the first end of the first condenser, and a source connected to the ground; and a second inverter circuit comprising:
- a fifth transistor having a source connected to the second power supply, a gate connected to the drain of the third transistor and to the drain of the fourth transistor, and a drain connected to an output node; and
- a sixth transistor having a drain connected to the drain of the fifth transistor and the output node, a gate connected to the drain of the third transistor and to the drain of the fourth transistor, and to the gate of the fifth transistor, and a source connected to the input node or to ground, and wherein the input signal is input into the source of the second transistor, and into the gate of the second transistor and an input of the first inverter circuit via the first condenser.

* * * * *